(12) United States Patent
Jangjian et al.

(10) Patent No.: US 8,847,286 B2
(45) Date of Patent: Sep. 30, 2014

(54) IMAGE SENSOR AND METHOD OF MANUFACTURING

(75) Inventors: Shiu-Ko Jangjian, Tainan (TW); Kei-Wei Chen, Tainan (TW); Szu-An Wu, Tainan (TW); Ying-Lang Wang, Tien-Chung Village (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/349,221

(22) Filed: Jan. 12, 2012

(65) Prior Publication Data
US 2013/0181258 A1 Jul. 18, 2013

(51) Int. Cl.
*H01L 27/148* (2006.01)

(52) U.S. Cl.
USPC ........... 257/231; 257/225; 257/228; 257/229; 257/230; 257/447; 257/460

(58) Field of Classification Search
USPC ......... 257/292, 294, 431, 443, 444, 445, 446, 257/461, 462, 288, 215, 225, 428, 447, 228, 257/460, E27.127, E27.13, E27.133, 257/E27.139, E31.127, E27.122, 229, 230
See application file for complete search history.

(56) References Cited

U.S. PATENT DOCUMENTS

2005/0139828 A1* 6/2005 Maruyama et al. ............. 257/59
2011/0186951 A1* 8/2011 Pyo ............................... 257/432

FOREIGN PATENT DOCUMENTS

WO WO 2009151274 A2 * 12/2009

* cited by examiner

*Primary Examiner* — Ermias Woldegeorgis
(74) *Attorney, Agent, or Firm* — Lowe Hauptman & Ham, LLP

(57) ABSTRACT

An image sensor includes a substrate having opposite first and second sides, a multilayer structure on the first side of the substrate, and a photo-sensitive element on the second side of the substrate. The photo-sensitive element is configured to receive light that is incident upon the first side and transmitted through the multilayer structure and the substrate. The multilayer structure includes first and second light transmitting layers. The first light transmitting layer is sandwiched between the substrate and the second light transmitting layer. The first light transmitting layer has a refractive index that is from 60% to 90% of a refractive index of the substrate. The second light transmitting layer has a refractive index that is lower than the refractive index of the first light transmitting layer and is from 40% to 70% of the refractive index of the substrate.

9 Claims, 7 Drawing Sheets

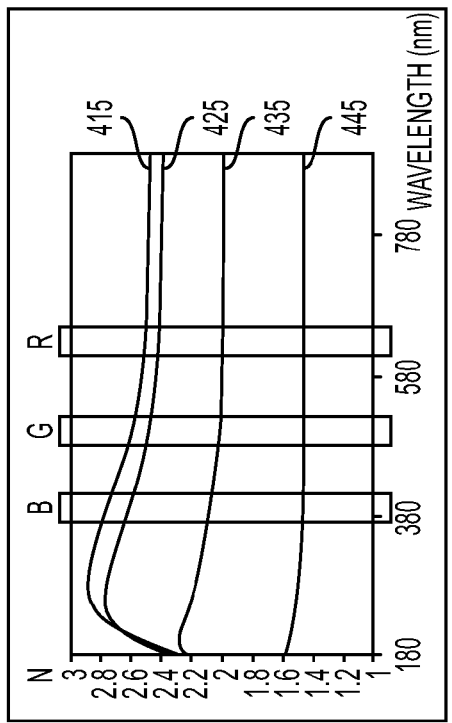
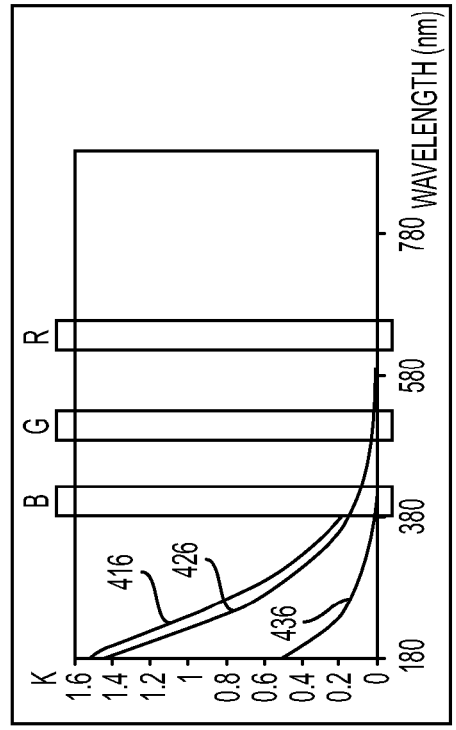
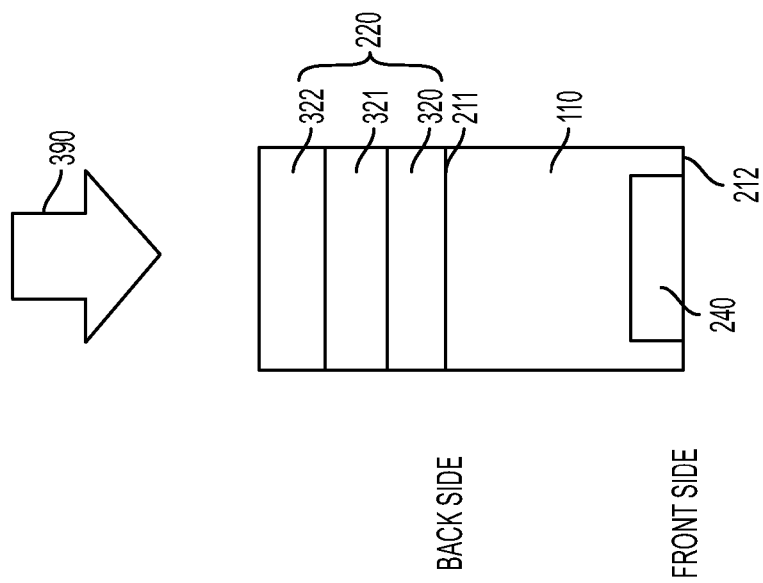

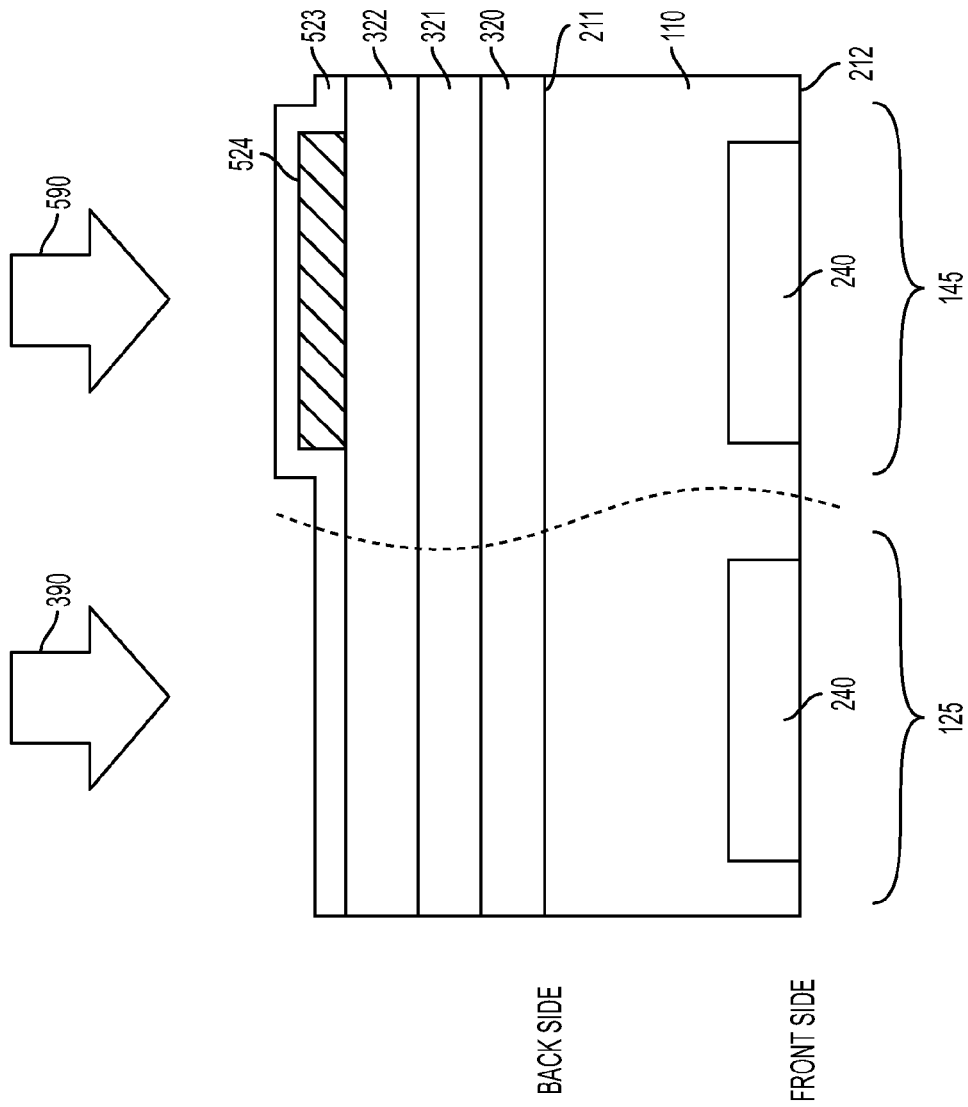

IMAGE SENSOR AND METHOD OF MANUFACTURING

BACKGROUND

Image sensors are widely used in various imaging applications and products, such as cameras, scanners, photocopiers, etc. The performance of an image sensor is evaluated, among other things, by its quantum efficiency. The quantum efficiency of an image sensor indicates the image sensor's electrical sensitivity to light.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3 is an enlarged view of the circled section of FIG. 2 rotated by 180 degrees.

FIG. 4A is a graph showing relationships between refractive indices of several materials and light wavelengths.

FIG. 4B is a graph showing relationships between extinction coefficients of several materials and light wavelengths.

FIG. 5 is a schematic, enlarged cross-sectional view of a section of an image sensor in accordance with some embodiments.

DETAILED DESCRIPTION

Figure 1:
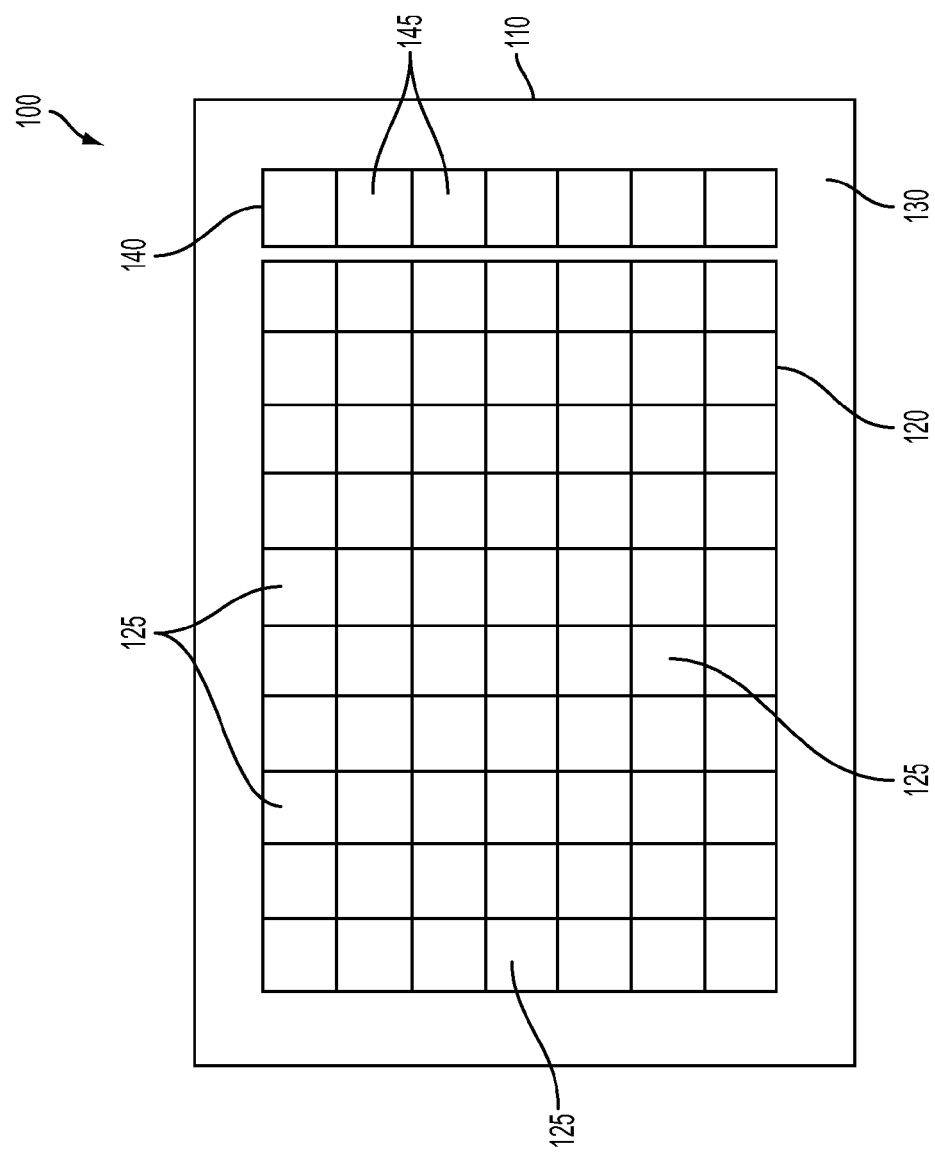
FIG. 1 is a schematic plan view of an image sensor in accordance with some embodiments.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

The drawings are not drawn to scale, and include certain features that are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic plan view of an image sensor 100 in accordance with some embodiments. The image sensor 100 includes a substrate 110 which has a pixel array region 120 and a logic region 130 outside the pixel array region 120.

The pixel array region 120 includes one or more pixels 125 arranged therein in an active pixel array. The pixels are configured to convert light to image data. In some embodiments, the pixels are complementary metal-oxide-semiconductor (CMOS) pixels, and the image sensor 100 is a CMOS image sensor (CIS). In some embodiments, the pixels are charged coupled device (CCD) image sensors. In some embodiments, the pixels 125 are monochromatic pixels. In some embodiments, the pixels 125 are color pixels arranged to detect different wavelengths (colors) in the incident light. In some embodiments, blue (B), green (G), red (R) pixels are used. Other color arrangements are usable in further embodiments.

The pixel array region 120 further includes one or more black level reference pixels 145 arranged in a black level reference pixel array 140. The black level reference pixels 145 are similar or identical to the pixels 125, except that a light shielding layer is provided to prevent the black level reference pixels 145 from receiving light. Thus, image data outputted by the black level reference pixels 145 provides a black level that is referenced to calibrate the image sensor 100 and/or to correct image data outputted by the pixels 125. In some embodiments, the black level reference pixels 145 are omitted.

The logic region 130 includes various circuitry for controlling the overall operation of the image sensor 100, outputting and/or processing and/or buffering image data captured by the pixels 125 and/or black level reference pixels 145, etc.

Figure 2:
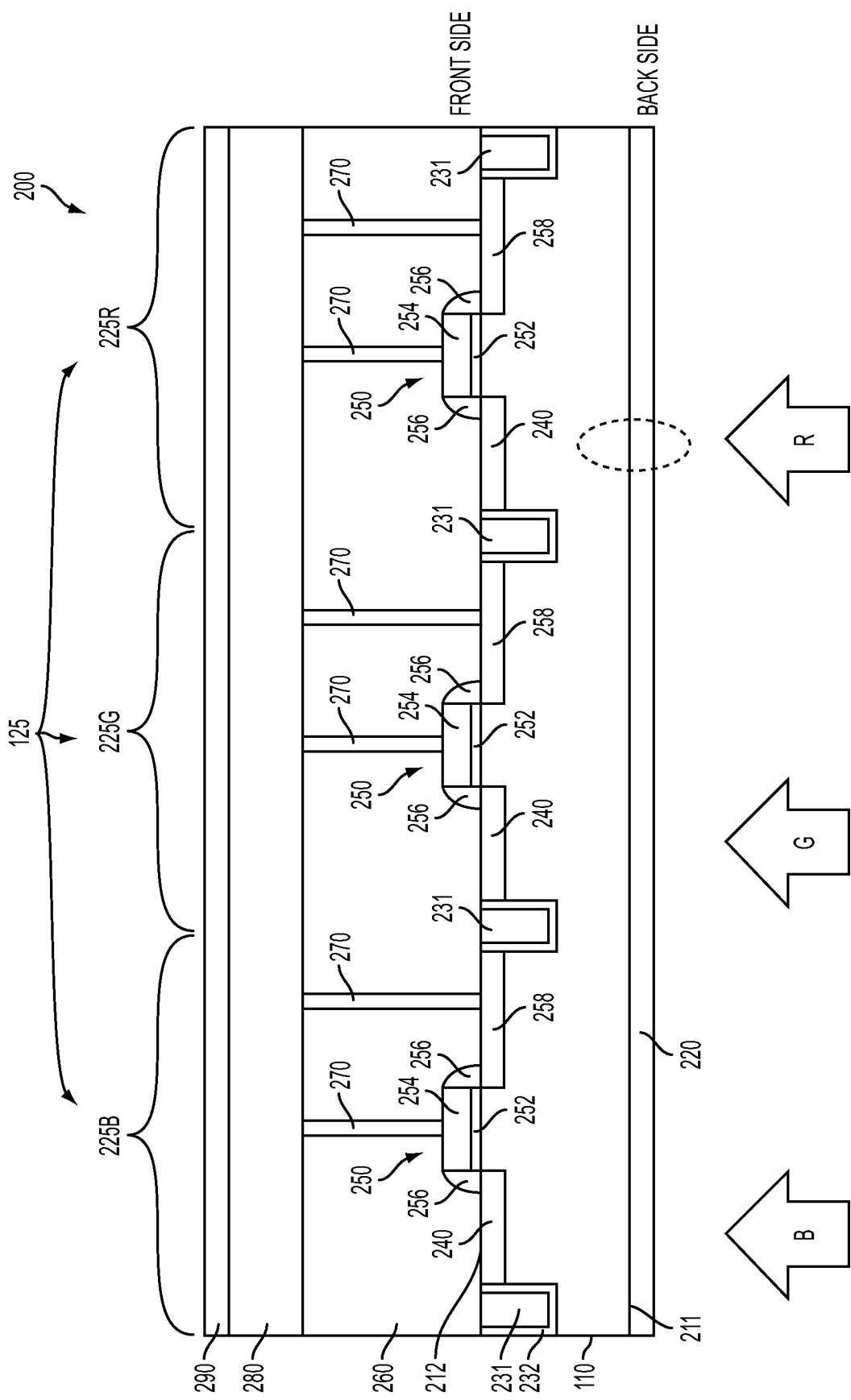
FIG. 2 is a schematic cross-sectional view of an image sensor segment in accordance with some embodiments.

FIG. 2 is a schematic cross-sectional view of a segment 200 of the image sensor 100 in accordance with some embodiments. The schematic cross-sectional view in FIG. 2 is taken in the pixel array region 120. Three pixels 125 are illustrated and designated in FIG. 2 as 225B, 225G, and 225R. The pixels 225B, 225G, and 225R are configured to convert B, G and R light into corresponding image data. The pixels 225B, 225G, and 225R are similarly structured except for a color filter included in or over each of the pixels 225B, 225G, and 225R on the back side 211 of the substrate 110. The pixels 225B, 225G, and 225R are commonly referred to herein as pixels 125 unless otherwise specified.

The substrate 110 includes opposite first and second sides, namely, a back side 211 and a front side 212. The pixels 125 are formed on the front side 212 of the substrate 110. A multilayer structure 220 is formed on the back side 211 of the substrate 110.

The substrate 110 is a semiconductor substrate. In some embodiments, the substrate 110 includes integrated circuits formed therein and/or thereon. The substrate 110 includes, but is not limited to, bulk silicon, a semiconductor wafer, a silicon-on-insulator (SOI) substrate, or a silicon germanium substrate. Other semiconductor materials including group III, group IV, and group V elements are used in some embodiments. The substrate 110 is undoped in some embodiments. In further embodiments, the substrate 110 is doped with a p-type dopant or an n-type dopant.

The substrate 110 includes, on the front side 212, a plurality of isolation features 231, such as shallow trench isolation (STI) features or local oxidation of silicon (LOCOS) features. The isolation features 231 define and isolate various elements or regions from each other. For example, the isolation features 231 isolate adjacent pixels 125 from each other, or the pixel array region (such as 120 in FIG. 1) from a logic region (such as 130 in FIG. 1), or components of the circuitry inside the logic region 130 from each other etc. In some embodiments, the isolation features 231 are filled with a dielectric material and/or lined with an oxide layer 232.

The substrate 110 includes, on the front side 212 and in each pixel 125, a photo-sensitive element 240 and at least one transistor 250 coupled to the photo-sensitive element 240. The photo-sensitive element 240 is configured to receive light (B, G or R) that is incident upon the back side 211 and transmitted through the multilayer structure 220 and the substrate 110 to the front side 212. The received light is then converted by the photo-sensitive element 240 into image data. The transistor 250 is coupled to the photo-sensitive element 240 to transfer the image data to circuitry in the logic region 130 for further processing and/or output.

In some embodiments, the photo-sensitive element 240 includes a photosensitive diode, such as a pinned layer photodiode. In some embodiments, the pinned layer photodiode is defined by one or more doped regions in the front side 212 of the substrate 110. In some embodiments, the doped regions are formed by ion implantation processes.

The transistor 250 includes a transfer transistor for transferring the image data captured by the corresponding photo-sensitive element 240 to external circuitry. In some embodiments, additional transistors with various functions are also included in each pixel 125. For example, a reset transistor, a source follower transistor, and/or a select transistor are included in each pixel 125 to define together with the transfer transistor a four-transistor CIS. Other CIS arrangements are usable in some embodiments. The principles described herein are also applicable to CCD pixels in further embodiments.

The transistor 250 includes a gate dielectric 252, a gate electrode 254 over the gate dielectric 252, spacers 256 on opposite sides of the gate electrode 254, and a source/drain region 258. The source/drain region 258 is formed opposite the photo-sensitive element 240 across the gate electrode 254. The source/drain region 258 includes one doped region formed by, for example, ion-implantation. In some embodiments, other transistors in each pixel 125 and/or on the logic region 130 are structured similarly to the transistor 250.

An inter-layer dielectric (ILD) 260 is over the pixel array region 120, including the pixels 125 with multiple photo-sensitive elements 240 and transistors 250 formed therein. The ILD 260 includes one or more dielectric layers, such as, boron phosphorous silicate glass (BPSG), plasma enhanced tetra-ethyl-ortho-silicate (PE-TEOS), or any other suitable dielectric materials. In some embodiments, the ILD 260 is formed by plasma enhanced chemical vapor deposition (PECVD) or low pressure chemical vapor deposition (LPCVD).

A plurality of contact vias 270 are formed through the ILD 260 to contact with the gate electrodes 254 and source/drain region 258 of the transistor 250. In some embodiments, the contact vias 270 are formed by photolithography, etching, metal deposition, etc.

A redistribution layer 280 is over the ILD 260 to define interconnections to the transistors 250 and the contact vias 270. The redistribution layer 280 includes alternating conductive and dielectric layers which are patterned and/or otherwise processed to form interconnections among the underlying devices (e.g., the transistors 250) and/or between the underlying devices and external circuitry.

A passivation layer 290 is over the redistribution layer 280 to protect the underlying layers from damage during subsequent processing and/or handling and/or operation. In some embodiments, the passivation layer 290 is made of a dielectric material, such as silicon oxide, silicon nitride, low-k dielectric materials, etc. by chemical vapor deposition (CVD). In some embodiments, one or more of layers 260, 280, 290 is/are omitted and/or other layers are included.

The multilayer structure 220 on the back side 211 of the substrate 110 is best described with reference to FIG. 3 which is an enlarged view of the circled section of FIG. 2 rotated by 180 degrees. The multilayer structure 220 is included to protect the substrate 110 which is, in some embodiments, only about 2-6 µm in thickness. The multilayer structure 220 is further configured to improve the quantum efficiency of the image sensor 100.

The multilayer structure 220 includes a surface repairing layer 320, a first light transmitting layer 321 and a second light transmitting layer 322 formed in the recited order over the back side 211 of the substrate 110. The surface repairing layer 320 is included for film conformity and/or for gap filling. In embodiments where the substrate 110 is an Si substrate, the surface repairing layer 320 is an $SiO_2$ layer although other materials are usable in further embodiments. The surface repairing layer 320 layer is formed in some embodiments by a rapid thermal oxidation, or LPCVD, or PECVD. In some embodiments, the surface repairing layer 320 is omitted.

The first light transmitting layer 321 and second light transmitting layer 322 are included to define a light transmitting medium having a refractive index that increases in the light transmission direction 390 from the outside of the image sensor 100, through the multilayer structure 220, to the back side 211 of the substrate 110, then through the substrate 110 to reach the photo-sensitive element 240 on the front side of the substrate 110. The first light transmitting layer 321 therefore has a refractive index higher than the second light transmitting layer 322 and lower than the substrate 110. The increasing refractive index from the second light transmitting layer 322, to the first light transmitting layer 321 then to the substrate 110 reduces light loss and contributes to improve the quantum efficiency of the image sensor 100.

Besides refractive index, another factor that contributes to the overall quantum efficiency of the substrate 110 is the extinction coefficient of the material layers in the multilayer structure 220. Material layers absorb light. The more a material layer absorbs light, the lower the quantum efficiency. As the extinction coefficient of a material layer is directly related to its light absorbance, material layers in the multilayer structure 220 are selected, in some embodiments, to have an extinction coefficient K as close to zero as possible.

In some embodiments, the first light transmitting layer 321 has a refractive index that is from 60% to 90% of a refractive index of the substrate 110, and the second light transmitting layer 322 has a refractive index that is lower than the refractive index of the first light transmitting layer 321 and is from 40% to 70% of the refractive index of the substrate 110. For example, where the substrate 110 is an Si substrate which has a refractive index of about 3.4, the material of the first light transmitting layer 321 is selected to have a refractive index in a range from about 2.0 to about 3.0 (which is relatively close to the refractive index of Si), whereas the material of the second light transmitting layer 322 is selected to have a refractive index in a range from about 1.36 (which is relatively close to the refractive index of air) to about 2.38. Such a multilayer arrangement with an increasing refractive index from air outside the image sensor 100 to the Si substrate improves the quantum efficiency of the image sensor 100. The quantum efficiency is further improved where the materials of the first light transmitting layer 321 and/or second light transmitting layer 322 are selected to have as small an extinction coefficient K as possible.

In some embodiments, a $SiO_2$ layer (which has a refractive index of about 1.4) is over the multilayer structure 220 as a capping or passivation layer. The incident light transmits from air (with the refractive index of 1), through the $SiO_2$ layer (with the refractive index of about 1.4) then through the second light transmitting layer 322, the first light transmitting layer 321 and the substrate 110 (with the refractive index of about 3.4 for an Si substrate). The material of the second light transmitting layer 322 is selected to have a refractive index around 2, whereas the material of the first light transmitting layer 321 is selected to have a refractive index between those of the first light transmitting layer 321 and the substrate 110. In one or more embodiments, the material of the second light transmitting layer 322 is selected to have a refractive index from 1.9 to 2.4 and the material of the first light transmitting layer 321 is selected to have a refractive index from 2.4 to 2.8. Again, the quantum efficiency is further improved where the materials of the first light transmitting layer 321 and/or second light transmitting layer 322 are selected to have extinction coefficients K that are as close to zero as possible.

FIG. 4A is a graph of relationships between refractive indices of several materials and light wavelengths, and FIG. 4B is a graph of relationships between extinction coefficients of several materials and light wavelengths. As can be seen in FIGS. 4A-4B, both refractive index and extinction coefficient vary with wavelength. In some embodiments, the selection of appropriate materials for the first light transmitting layer 321 and/or second light transmitting layer 322 is made based on the refractive index and extinction coefficient in B, G and R wavelength regions, i.e., the wavelength which will pass through the color filters of the pixels 125. In some embodiments where monochrome pixels or pixels for capturing images outside the visible spectrum, e.g., infrared pixels, are used, the selection of appropriate materials for the first light transmitting layer 321 and/or second light transmitting layer 322 is made based on the refractive index and extinction coefficient in the corresponding wavelength regions.

In FIG. 4A, lines 415, 425, 435, 445 correspond to the refractive indices of a 500 Å layer of SiC, a 250 Å layer of SiC, a layer of SiOC, and a layer of $SiO_2$. As can be seen in FIG. 4A, the refractive index changes at about the same increment in all B, G and R wavelength regions from the refractive index of air (which is 1) to refractive index of $SiO_2$ (line 445), then to the refractive index of SiOC (line 435), then to the refractive index of either layer of SiC (lines 415, 425). Thus, in accordance with some embodiments, a multilayer structure including (from the top down), an $SiO_2$ layer (e.g., a capping layer), the second light transmitting layer 322 of SiOC, and the first light transmitting layer 321 of SiC provides a relative smooth transition of refractive index from the outside toward the Si substrate 110. Such an arrangement contributes to improve the quantum efficiency of the image sensor 100. The corresponding K values shown in FIG. 4B for the 500 Å layer of SiC (line 416), the 250 Å layer of SiC (line 426), and the layer of SiOC (line 436) also show acceptably low extinction coefficients K in the B, G and R wavelength regions. Especially, the SiOC layer (line 436) has an almost zero extinction coefficient in all B, G and R wavelength regions which further contributes to improve the quantum efficiency of the image sensor 100.

In some embodiments, the capping or passivation layer is formed of $SiO_2$ and/or a silicon nitride.

In some embodiments, the first light transmitting layer 321 of SiC is formed by CVD, PECVD, sputtering, or other suitable methods. In one or more embodiments, the first light transmitting layer 321 is formed to have a thickness from 300 Å to 1000 Å.

In some embodiments, the second light transmitting layer 322 of SiOC is formed by PECVD or other suitable methods. The refractive index of the SiOC layer varies in accordance with the C content in SiOC. The C content in SiOC is controllable by varying one or more PECVD conditions, e.g., the gas flow rate, substrate temperature, etc. The C content from 30 atom % to 50 atom % has been found to provide an SiOC layer with appropriate refractive index and extinction coefficient. In one or more embodiments, the second light transmitting layer 322 is formed to have a thickness from 200 Å to 800 Å.

FIG. 5 is a schematic, enlarged cross-sectional view of a section of an image sensor in accordance with some embodiments. The cross-section view in FIG. 5 partially shows two pixels, namely, an image pixel 125 and a black level reference pixel 145. The black level reference pixel 145 is structured similarly to the pixel 125. An additional light shielding layer 524 is over the second light transmitting layer 322 and corresponding to the black level reference pixel 145 to prevent light 590 incident on the light shielding layer 524 from transmitting to the black level reference pixel 145. Thus, the black level reference pixel 145 is configured to output image data indicating a black level that is referenced to calibrate the image sensor 100 and/or to correct image data outputted by the pixel 125. A capping or passivation layer 523 is over the second light transmitting layer 322 and light shielding layer 524 on the back side, and corresponding to the pixel 125 and black level reference pixel 145 on the front side.

In some embodiments, the formation of the light shielding layer 524 includes depositing a metal layer (or a layer of another opaque material) over the second light transmitting layer 322 and, then the deposited layer is etched to leave the light shielding layer 524 in a region corresponding to the black level reference pixel 145 on the front side. The etching of the light shielding layer 524, under certain circumstances, introduces F atoms, e.g., from an F-based etchant, into the underlying SiOC layer (i.e., the second light transmitting layer 322). The introduced F atoms, under certain circumstances, affect optical properties of the SiOC layer which, in turn, affects the quantum efficiency of the image sensor. It has been found that an F content in the SiOC layer not greater than 3 atom % is acceptable.

FIGS. 6A-6D are schematic cross-sectional views of an image sensor 600 being manufactured in accordance with some embodiments.

Figure 6A:
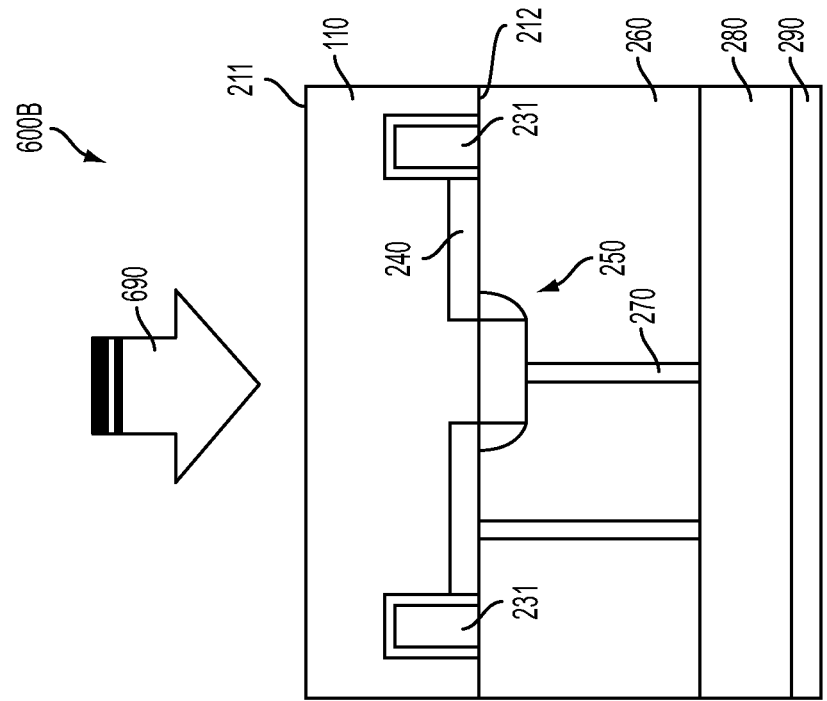
FIGS. 6A-6D are schematic cross-sectional views of an image sensor being manufactured in accordance with some embodiments.

At the stage in FIG. 6A, a front side processing is performed on a front side 212 of a substrate 110. The substrate 110 further has an opposite back side 211. The front side processing includes forming, in a pixel array region 120 on the front side 212, a plurality of pixels 125. Each pixel 125 is formed to include a photo-sensitive element 240 coupled with at least one transistor 250.

In some embodiments, one or more isolation features 231 are further formed adjacent each pixels 125. The front side processing further includes forming an ILD 260 over the pixel array region 120 including the photo-sensitive elements 240 and corresponding transistors 250. Contact vias 270 are formed through the ILD 260 to contact with the transistors 250. A redistribution layer 280 is formed over the ILD 260 to define interconnections to the transistors 250 and the contact vias 270. A passivation layer 290 is formed over the redistribution layer 280. A resulting structure 600A is obtained.

Figure 6B:
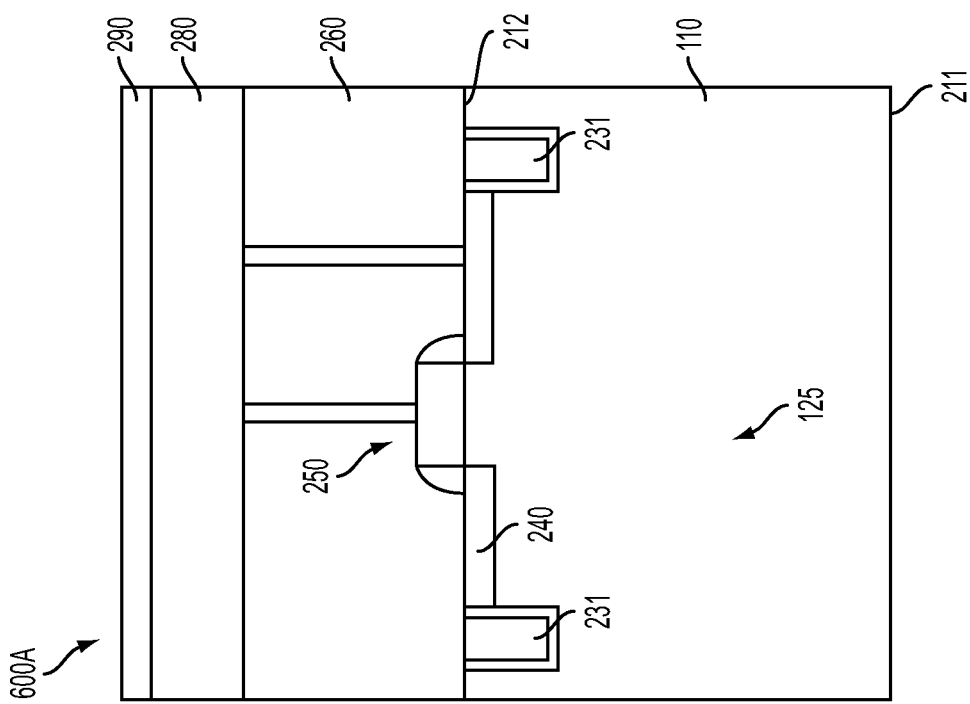

At the stage in FIG. 6B, the resulting structure 600A is turned up-side-down and thinned from the back side 211, as indicated by an arrow 690. The thinning process is to reduce the distance that incident light on the back side 211 travels through the substrate 110 to reach the photo-sensitive element 240 on the front side 212. In some embodiments, the thinning is performed by chemical mechanical polishing (CMP) or other suitable processes. In some embodiments, the thinning is performed until the thickness of the substrate 110 remains from 2 μm to 6 μm. A resulting structure 600B is obtained.

Figure 6D:
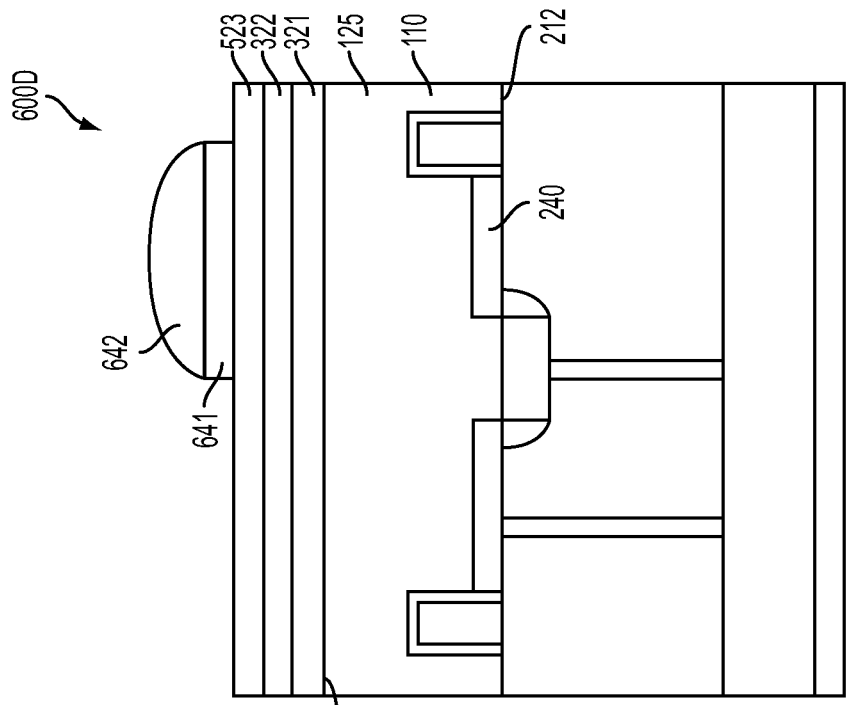
Figure 6C:
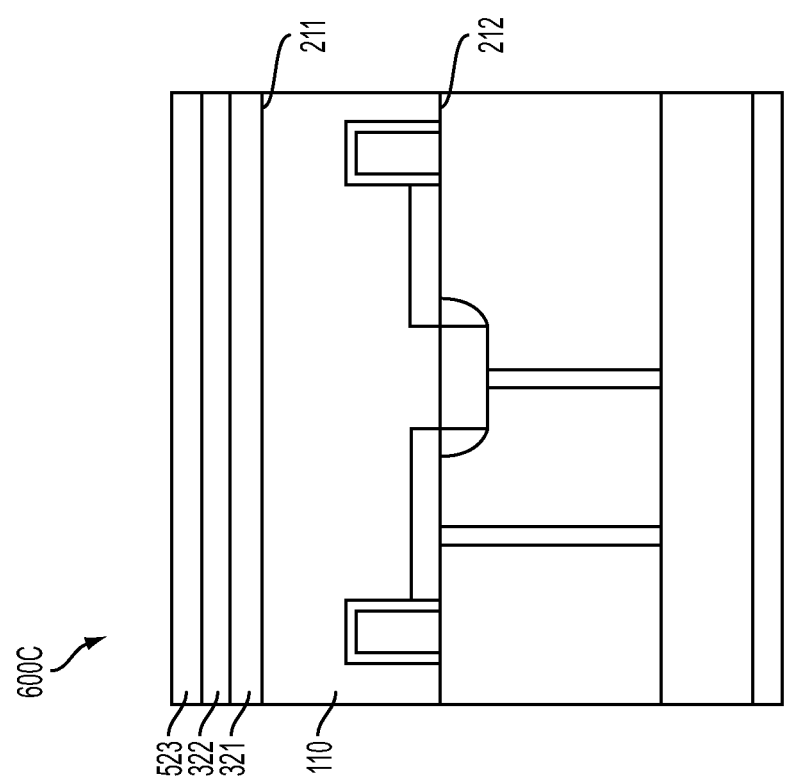

At stage in FIG. 6C, a plurality of material layers, such as the light transmitting layer 321, second light transmitting layer 322, and capping or passivation layer 523 are sequentially formed over the back side 211 of the thinned substrate 110 to correspond to the pixel array region 120 on the front side 212. The layers 321, 322, 523 have refractive indices that decrease upwardly and away from the substrate 110 to improve the quantum efficiency of the image sensor. The materials of one or more of the layers 321, 322, 523 are selected to have extinction coefficients which are as close to zero as possible. In some embodiments, an $SiO_2$ is formed between the back side 211 of the substrate 110 and the first light transmitting layer 321. In some embodiments, the first light transmitting layer 321 includes SiC and/or the second light transmitting layer 322 includes SiOC formed over and in direct contact with the SiC layer and/or the capping or passivation layer 523 includes $SiO_2$ or a silicon nitride. A resulting structure 600C is obtained.

At stage in FIG. 6D, a color filter 641 and a microlens 642 are sequentially formed, for each pixel 125, on the back side 211 of the substrate 110. The color filter 641, in some embodiments, is a B, G or R color filter and includes a polymeric or resin with colored pigments. The microlens 642 is included to focus incident light onto the photo-sensitive element 240. The microlens 642, in some embodiments, is formed by patterning and the baking a positive type photoresist to cause the photoresist to curve into the microlens 642. The image sensor 600 is obtained.

In some embodiments, the color filter 641 and microlens 642 are incorporated in one or more of the layers 523, 322, or 321. In some embodiments, the formation of the color filter 641 and/or microlens 642 is omitted. In some embodiments, the number of layers formed over the back side 211 of the substrate 110 at the stage in FIG. 6C is more than 4.

Figure 7:
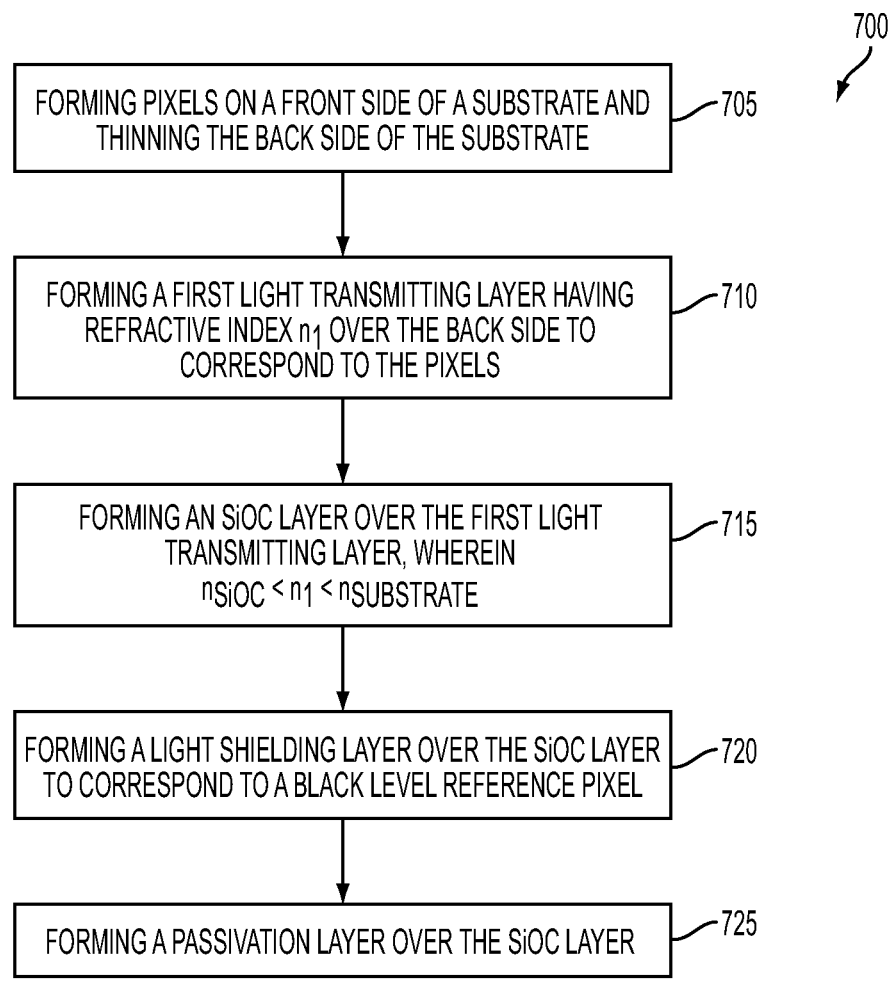
FIG. 7 is a flow chart of a method of manufacturing an image sensor in accordance with some embodiments.

FIG. 7 is a flow chart of a method 700 of manufacturing an image sensor in accordance with some embodiments.

At step 705, pixels are formed on a front side of a substrate and the back side of the substrate is thinned. For example, pixels 125 are formed on the front side 212 of a substrate 110, as described with respect to FIG. 6A, and the back side 211 of the substrate 110 is thinned, as described with respect to FIG. 6B.

At step 710, a first light transmitting layer having a refractive index $n_1$ is formed over the back side of the substrate which has a refractive index $n_{substrate}$. For example, a first light transmitting layer 321 having a refractive index $n_1$ is formed over the back side 211 of the substrate 110, as described with respect to FIG. 6C.

At step 715, a second light transmitting layer having a refractive index $n_2$ is formed over the first light transmitting layer wherein $n_2 < n_1 < n_{substrate}$. In some embodiments, the second light transmitting layer is made of SiOC.

At step 720, a light shielding layer is formed over the second light transmitting layer on the back side to correspond to a black level reference pixel on the front side. For example, a light shielding layer 524 is formed over the second light transmitting layer 322 on the back side 211 to correspond to a black level reference pixel 145 on the front side 212, as described with respect to FIG. 5.

At step 725, a passivation layer is formed over the second light transmitting layer. For example, a capping or passivation layer 523 is formed over the second light transmitting layer 322 and the light shielding layer 524 as described with respect to FIG. 5. In some embodiments, steps 705, 720, 725 are omitted.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, an image sensor comprises a substrate having opposite first and second sides, a multilayer structure on the first side of the substrate, and a photo-sensitive element on the second side of the substrate. The photo-sensitive element is configured to receive light that is incident upon the first side and transmitted through the multilayer structure and the substrate. The multilayer structure comprises first and second light transmitting layers. The first light transmitting layer is sandwiched between the substrate and the second light transmitting layer. The first light transmitting layer has a refractive index that is from 60% to 90% of a refractive index of the substrate. The second light transmitting layer has a refractive index that is lower than the refractive index of the first light transmitting layer and is from 40% to 70% of the refractive index of the substrate.

According to some embodiments, a back side illuminated (BSI) image sensor comprises an Si substrate, a multilayer structure, and a plurality of pixels. The Si substrate has a back side and a front side opposite to the back side. The Si substrate includes a pixel array region and a logic region outside the pixel array region. The multilayer structure is formed on the back side of the Si substrate corresponding to the pixel array region. The plurality of pixels is formed on the front side of the Si substrate and in the pixel array region. Each pixel comprises a photo-sensitive element and a transistor. The photo-sensitive element is configured to convert light, which is incident upon the back side and transmitted through the multilayer structure and the Si substrate, into image data. The transistor is coupled to the photo-sensitive element to transfer the image data to circuitry in the logic region. The multilayer structure comprises an SiC layer formed over the back side of the Si substrate, and an SiOC layer formed over and in direct contact with the SiC layer.

According to some embodiments, a back side illuminated (BSI) image sensor comprises an Si substrate, a multilayer structure, and a plurality of pixels. The Si substrate has a back side and a front side opposite to the back side. An oxide layer is formed on the back side of the Si substrate. The Si substrate includes a pixel array region and a logic region outside the pixel array region. The multilayer structure is formed over the oxide layer and corresponding to the pixel array region. The plurality of pixels is formed on the front side of the Si substrate and in the pixel array region. Each pixel comprises a photo-sensitive element and a transistor. The photo-sensitive element is configured to convert light, which is incident upon the back side and transmitted through the multilayer structure and the Si substrate, into image data. The transistor is coupled to the photo-sensitive element to transfer the image data to circuitry in the logic region. The multilayer structure comprises an SiC layer formed over the oxide layer, and an SiOC layer formed over and in direct contact with the SiC layer. A passivation layer is formed over the multilayer structure.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A back side illuminated (BSI) image sensor, comprising:
an Si substrate having a back side and a front side opposite to the back side, the Si substrate including a pixel array region and a logic region outside the pixel array region;

a multilayer structure formed on the back side of the Si substrate and corresponding to the pixel array region; and a plurality of pixels formed on the front side of the Si substrate and in the pixel array region, each pixel comprising:

a photo-sensitive element configured to convert light, which is incident upon the back side and transmitted through the multilayer structure and the Si substrate, into image data, and a transistor coupled to the photo-sensitive element to transfer the image data to circuitry in the logic region;

wherein the multilayer structure comprises an SiC layer formed over the back side of the Si substrate, and an SiOC layer formed over and in direct contact with the SiC layer.

2. The BSI image sensor of claim 1, wherein the SiOC layer has a C content from 30 atom % to 50 atom %.

3. The BSI image sensor of claim 2, wherein the SiOC layer has an F content of no more than 3 atom %.

4. The BSI image sensor of claim 3, further comprising:
a passivation layer formed over the SiOC layer, the passivation layer formed of a silicon nitride or $SiO_2$.

5. The BSI image sensor of claim 4, further comprising:
a $SiO_2$ layer between the Si substrate and the SiC layer.

6. The BSI image sensor of claim 3, wherein
the SiOC layer has a thickness from 200 to 800 Å; and
the SiC layer has a thickness from 300 to 1000 Å.

7. The BSI image sensor of claim 1, further comprising:
a black level reference pixel formed on the front side of the Si substrate; and a light shielding layer formed on the back side of the Si substrate to shield the black level reference pixel from incident light;

wherein the multilayer is sandwiched between the light shielding layer and the Si substrate.

8. A back side illuminated (BSI) image sensor, comprising:

an Si substrate having a back side and a front side opposite to the back side, the Si substrate including a pixel array region and a logic region outside the pixel array region;

an oxide layer formed on the back side of the Si substrate;

a multilayer structure formed over the oxide layer and corresponding to the pixel array region; and a plurality of pixels formed on the front side of the Si substrate and in the pixel array region, each pixel comprising:

a photo-sensitive element configured to convert light, which is incident upon the back side and transmitted through the multilayer structure and the Si substrate, into image data, and a transistor coupled to the photo-sensitive element to transfer the image data to circuitry in the logic region;

wherein the multilayer structure comprises an SiC layer formed over the oxide layer, and an SiOC layer formed over and in direct contact with the SiC layer; and a passivation layer formed over the multilayer structure.

9. The BSI image sensor of claim 8, wherein the SiOC layer has a C content from 30 atom % to 50 atom % and an F content of no more than 3 atom %.

* * * * *